(12) United States Patent
Han et al.

(10) Patent No.: US 11,346,866 B2
(45) Date of Patent: May 31, 2022

(54) FAST-RESPONSE DIRECT-CURRENT CURRENT TRANSFORMER BASED ON MULTI-SENSOR FUSION

(71) Applicant: HUAZHONG UNIVERSITY OF SCIENCE AND TECHNOLOGY, Hubei (CN)

(72) Inventors: Xiaotao Han, Hubei (CN); Shaozhe Zhang, Hubei (CN); Yilin Wang, Hubei (CN); Jianfeng Xie, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/288,000

(22) PCT Filed: Dec. 3, 2020

(86) PCT No.: PCT/CN2020/133573
§ 371 (c)(1),
(2) Date: Apr. 23, 2021

(87) PCT Pub. No.: WO2021/243989
PCT Pub. Date: Dec. 9, 2021

(65) Prior Publication Data
US 2022/0128604 A1 Apr. 28, 2022

(30) Foreign Application Priority Data

Jun. 4, 2020 (CN) .......................... 202010497795.7

(51) Int. Cl.
*G01R 15/20* (2006.01)
*H03F 3/21* (2006.01)

(52) U.S. Cl.
CPC ............ *G01R 15/202* (2013.01); *H03F 3/21* (2013.01)

(58) Field of Classification Search
CPC ................................ G01R 15/202; H03F 3/21
(Continued)

(56) References Cited

U.S. PATENT DOCUMENTS 8,258,735 B2 * 9/2012 Kitanaka ............. H02P 21/0089
318/400.3
2007/0247141 A1 * 10/2007 Pastre .................... G01R 33/07
324/202

(Continued)

FOREIGN PATENT DOCUMENTS

CN      111398650      7/2020

OTHER PUBLICATIONS

"International Search Report (Form PCT/ISA/210) of PCT/CN2020/133573," dated Feb. 25, 2021, pp. 1-5.
(Continued)

*Primary Examiner* — Tung X Nguyen
*Assistant Examiner* — Robert P Alejnikov, Jr.
(74) *Attorney, Agent, or Firm* — JCIP Global Inc.

(57) ABSTRACT

A fast-response direct-current current transformer based on multi-sensor fusion is provided and includes: a magnetic modulator, a current correction module, an excitation transformer, an alternating current detection and filtering circuit, a phase-sensitive demodulation and filtering system, a PI controller, and a power amplifier. The current correction module measures a primary current and obtain a feed-forward signal, outputs a false balance state configured to control a magnetic core to quickly exit or avoid entering magnetic saturation after amplifying the feed-forward signal and a PI control signal, and keeps output of the magnetic modulator stable. The magnetic modulator and Hall current sensors are fused in the disclosure, such that the possibility of failure due to a false balance problem caused by saturation of a magnetic core is reduced. After the false balance is
(Continued)

generated, the magnetic core may be controlled to quickly exit a magnetic saturation state through a feed-forward output current.

16 Claims, 3 Drawing Sheets

(58) Field of Classification Search
USPC .......................................................... 324/127
See application file for complete search history.

(56) References Cited

U.S. PATENT DOCUMENTS

2016/0334473 A1* 11/2016 Snoeij .................... G01R 33/04
2018/0191282 A1* 7/2018 Dent ........................ H02H 9/02

OTHER PUBLICATIONS

Ren, Shiyan et al., "The Stability of High DC Current Comparator with Double Magnetic Detector," Journal of Huazhong University of Science and Technology(Nature Science Edition), vol. 29, No. 11, Nov. 2001, pp. 1-4.

* cited by examiner

FAST-RESPONSE DIRECT-CURRENT CURRENT TRANSFORMER BASED ON MULTI-SENSOR FUSION

BACKGROUND

Technical Field

The disclosure relates to a technical field of current detection, and in particular, relates to a fast-response direct-current current transformer based on multi-sensor fusion.

Description of Related Art

Heavy current (specifically refers to a high-intensity current greater than or equal to 1 kA) is widely applied in various industries such as industrial production, direct current (DC) transmission, high-speed railways, and scientific experiments. As such, the techniques used for heavy current measurement have always been important research topics. At present, the methods commonly used for DC heavy current measurement include the use of a shunt, a DC transformer, a Rogowski coil sensor, an optical fiber sensor, and a Hall effect DC sensor and so on. Nevertheless, problems such as low measurement accuracy and considerable temperature drifting may occur in most of the heavy current sensors, and the requirements of highly precise, fast, and stable measurement of 10 ppm level of the DC heavy current may not be satisfied as a result.

In recent decades, the DC heavy current measurement technique based on the fluxgate has been extensively studied and developed rapidly. Among them, as the most accurate current sensor on the market, the Direct-Current Current Transformer (DCCT) has a measurement accuracy of up to 10 ppm, has considerably low temperature drifting, and features high stability and high sensitivity. Therefore, this type of precision current sensors are adopted by current sensor giants such as LEM, Hitech, and Bergoz. Although at present, the DCCT industry is mature, but research and improvement of solutions to problems related to false balance and dynamic response performance are still important issues.

The "false balance phenomenon" refers to the fact that the magnetic core material of the DCCT is completely saturated, the output of the magnetic modulator is zero and it does not respond to any input, and the system enters a false balance state. The reasons for this phenomenon are: (1) Before the power is turned on, the measured current passing through the magnetic core of the magnetic modulator already exists; (2) The measured current exceeds the compensation range of the DCCT; (3) The amplitude of the measured current changes rapidly in a wide range. At this time, the sensor cannot work at all and cannot automatically exit from the abnormal state. Such false balance greatly limits the application range of the DCCT.

At present, the commonly-used false balance solutions may be divided into two types: the system restart method and the secondary current scanning method. The system restart method refers to that: the entire system is turned off, the DCCT is turned on first, and the measured current is then loaded after the PI feed-back loop starts to work. This method is inefficient and may not be widely used. Therefore, the secondary current scanning method is widely used at present to solve the false balance problem. That is, a scanning module is added to the circuit, which is usually formed by a low-frequency triangular wave generator and a voltage comparator. The module monitors the working status in real time. When the false balance is detected, the secondary winding disconnects the PI feed-back loop to connect to the scanning module, and the circuit enters the scanning state, trying to find the zero magnetic flux state. Once the zero magnetic flux state is scanned, the scanning module exits its work and returns the control to the PI feed-back loop, and the circuit returns to its normal working state.

Although the application of the secondary current scanning method is mature, two problems are still found with this method: (1) The current scanning process is slow. When false balance occurs, the magnitude of the measured current, that is, the balance point, is unknown, and in order to prevent the system from missing the balance point because it is too late to react, scanning must be performed slowly. Besides, the inductance of the secondary coil of a large-range DCCT is large, and the fast scanning speed means a large voltage power supply. Further, when the balance state is found, the current needs to be stabilized quickly to avoid instability again. At this time, a large induced voltage may be generated and the equipment may be damaged. (2) The dynamic response performance of the system is not improved. Even if the system leaves the false balance state and the measured current experiences the same large-scale fluctuation again, the system will still enter the false balance and scanning is required to start again, which is inefficient.

SUMMARY

According to the above technical defects, the disclosure provides a fast-response Direct-Current Current Transformer (DCCT) based on multi-sensor fusion aiming to improve a dynamic response capability of a DCCT without affecting steady-state performance such as measurement accuracy, stability, time drifting, and temperature drifting of the DCCT. In this way, a false balance state is prevented from occurring in a dynamic process of the DCCT, automatic recovery of the false balance state caused by live closing, overloading, etc. is achieved, and precise measurement of a large-scale dynamic DC heavy current is accomplished.

The disclosure further provides a fast-response DCCT based on multi-sensor fusion including: a magnetic modulator, a current correction module, an excitation transformer, an alternating current (AC) detection and filtering circuit, a phase-sensitive demodulation and filtering system, a PI controller, and a power amplifier. An excitation voltage input terminal of the magnetic modulator is connected to an output terminal of the excitation transformer. A feed-back input terminal is connected to an output terminal of the power amplifier and is configured to excite a magnetic core of the magnetic modulator through an excitation voltage. A balance determination signal is outputted by a first signal output terminal to the phase-sensitive demodulation and filtering system, and an AC induced voltage signal is outputted by a second signal output terminal to the AC detection and filtering circuit. The current correction module is configured to measure a primary current and obtain a feed-forward signal, output a false balance state configured to control a magnetic core to quickly exit or avoid entering magnetic saturation after amplifying the feed-forward signal and a PI control signal, and keep output of the magnetic modulator stable. An input terminal of the excitation transformer 3 is configured to be connected to a power frequency AC. A first output terminal is connected to the excitation voltage input terminal of the magnetic modulator, and a second output terminal is connected to a second input terminal of the phase-sensitive demodulation and filtering system and is configured to provide a periodic excitation voltage for the magnetic modulator and provide the phase-sensitive demodulation and filtering system with a required square wave signal. An input terminal of the AC detection and filtering circuit is connected to the second signal output terminal of the magnetic modulator and is configured to perform detecting and filtering on the AC induced voltage signal outputted by the magnetic modulator. A first input terminal of the phase-sensitive demodulation and filtering system is connected to a first output terminal of the magnetic modulator, and the second input terminal is connected to a third output terminal of the excitation transformer and is configured to perform phase-sensitive demodulation processing on the balance determination signal and output a balance adjustment signal. A first input terminal of the PI controller is connected to an output terminal of the AC detection and filtering circuit, and a second input terminal is connected to an output terminal of the phase-sensitive demodulation and filtering system and is configured to perform proportional integral control on the filtered AC induced voltage signal and the balance adjustment signal and output the stable PI control signal. An input terminal of the power amplifier is connected to an output terminal of the current correction module and is configured to output the feed-back signal after performing power amplifying and filtering processing on the feed-forward signal and the PI control signal.

In the disclosure, due to the fusion of the magnetic modulator and Hall current sensors, a strong dynamic response capability is provided. Fast response is performed in the face of a wide range of current amplitude changes, which greatly reduces the possibility of failure of the DCCT due to the false balance problem caused by the saturation of the magnetic core. Further, when the false balance is generated, in the disclosure, the magnetic core may be controlled to quickly exit the magnetic saturation state through the feed-forward output current of the Hall current sensors. The system is not required to be restarted or scanned for a long time, which greatly reduces the time for the DCCT to resume normal work and response.

Further, the magnetic modulator includes: a first magnetic core $C_1$, a second magnetic core $C_2$, an AC feed-back magnetic core $C_3$, a first winding $W_1$, a second winding $W_2$, an AC induction winding $W_3$, and a secondary winding $W_S$. The first magnetic core $C_1$ and the second magnetic core $C_2$ are disposed parallel to each other, and the first magnetic core $C_1$ and the second magnetic core $C_2$ are disposed in the AC feed-back magnetic core $C_3$ after being wrapped by an insulating material. The first winding $W_1$ is wound on the first magnetic core $C_1$, and the second winding $W_2$ is wound on the second magnetic core $C_2$. The first winding $W_1$ and the second winding $W_2$ are connected in series, configured to detect magnitude of a magnetic flux in the first magnetic core $C_1$ and the second magnetic core $C_2$, and output the balance determination signal. The induction winding $W_3$ is wound on the AC feed-back magnetic core $C_3$, and the AC induction winding $W_3$ is configured to detect magnitude of a magnetic flux in the AC feed-back magnetic core and output the AC induced voltage signal. The secondary winding $W_S$ is wound on the insulating material that wraps the AC feed-back magnetic core $C_3$, configured to ensure a balance kept between a DC magnetic potential generated by a secondary current $I_2$ and a magnetic potential of a primary current $I_1$, and calculate a current value to be measured according to magnitude of the secondary current.

Further, the first winding $W_1$ and the second winding $W_2$ are connected in reverse series, and alternating magnetic fluxes caused by excitation currents in the first magnetic core $C_1$ and the second magnetic core $C_2$ keep equal in magnitude and opposite in direction at all times.

Further, materials of the first magnetic core $C_1$ and the second magnetic core $C_2$ are both ferromagnetic materials with a high rectangular coefficient and a small coercive force.

Further, the materials of the first magnetic core $C_1$ and the second magnetic core $C_2$ are both cold-rolled silicon steel sheets with crystal grain orientation, permalloy, or amorphous alloy.

Further, a shape of each of the first magnetic core $C_1$ and the second magnetic core $C_2$ is a circular ring, a diameter of each of the modulation magnetic cores is determined by factors such as a measured busbar and a number of turns of the secondary winding, and the busbar is required to be ensured to pass through an inside of a modulation iron core ring when a DC heavy current is measured.

In the embodiments of the disclosure, the current correction module provides a feed-forward function and adjusts a secondary feedback current instantly according to magnitude of the primary current. When a range of the primary current changes, Hall current sensors branch and the magnetic core produce mutual inductance and work together. The instant output of the power amplifier avoids saturation of the magnetic core and strengthens the mutual inductance capability of the magnetic core, and mutual inductance may make the system enter the zero magnetic flux state faster. After the primary current enters the steady state, since the output of the Hall sensor gives the power amplifier a static operating point, the feed-back loop of the magnetic modulator only needs to provide a small voltage to ensure zero magnetic flux. Since the Hall current sensors is outside the feed-back loop, it may not affect the detection of zero magnetic flux, so current measurement accuracy and stability is not affected.

Further, the current correction module includes: Hall current sensor chips and a signal conditioning circuit. The Hall current sensor chips is configured to detect a current to be measured and control the magnetic core to quickly exit or avoid entering the false balance state of the magnetic saturation according to the current to be measured and the feed-forward signal provided by the power amplifier to the magnetic modulator, such that the output of the magnetic modulator is kept stable. The signal conditioning circuit is configured to filter and adjust output signals of the Hall current sensor chips and the PI controller.

Further, a number of the Hall current sensor chips is eight, and the eight Hall current sensor chips are divided into four groups that are perpendicular to each other and symmetrically arranged on an inner side of the ring-shaped magnetic modulator.

Further, the phase-sensitive demodulation and filtering system includes: a frequency selection circuit, a synchronous square wave circuit, a second-order band pass filter, an analog multiplier, and a second-order low-pass filter. An input terminal of the frequency selection circuit acts as the first input terminal of the phase-sensitive demodulation and filtering system and is configured to extract a second harmonic signal in a winding input signal. An input terminal of the synchronous square wave circuit acts as the second input terminal of the phase-sensitive demodulation and filtering system and is configured to process an excitation voltage and ensure phase synchronization of an outputted phase reference square wave signal and the second harmonic signal outputted by the frequency selection circuit. An input terminal of the second-order band pass filter is connected to an output terminal of the frequency selection circuit and is configured to filter the second harmonic signal. A first input terminal of the analog multiplier is connected to an output terminal of the second-order band pass filter, and a second input terminal is connected to an output terminal of the synchronous square wave circuit and is configured to output the balance adjustment signal after performing phase-sensitive demodulation on the filtered second harmonic signal and the phase reference square wave signal. An input terminal of the second-order low-pass filter is connected to an output terminal of the analog multiplier and is configured to output a balance adjustment signal without high frequency noise after and filtering the balance adjustment signal.

Compared to the related art, the DCCT based on multi-sensor fusion provided by the disclosure features a strong dynamic response capability because the design of fusion with the Hall current sensor is adopted. Fast response is performed in the face of a wide range of current amplitude changes, which greatly reduces the possibility of failure of the DCCT due to the false balance problem caused by the saturation of the magnetic core. When the false balance is generated, in the sensor fusion design provided by the disclosure, the magnetic core may be allowed to quickly exit the magnetic saturation state through the feed-forward output current of the Hall current sensor. The system is not required to be restarted or scanned for a long time, which greatly reduces the time for the DCCT to resume normal work and response.

Figure 1:
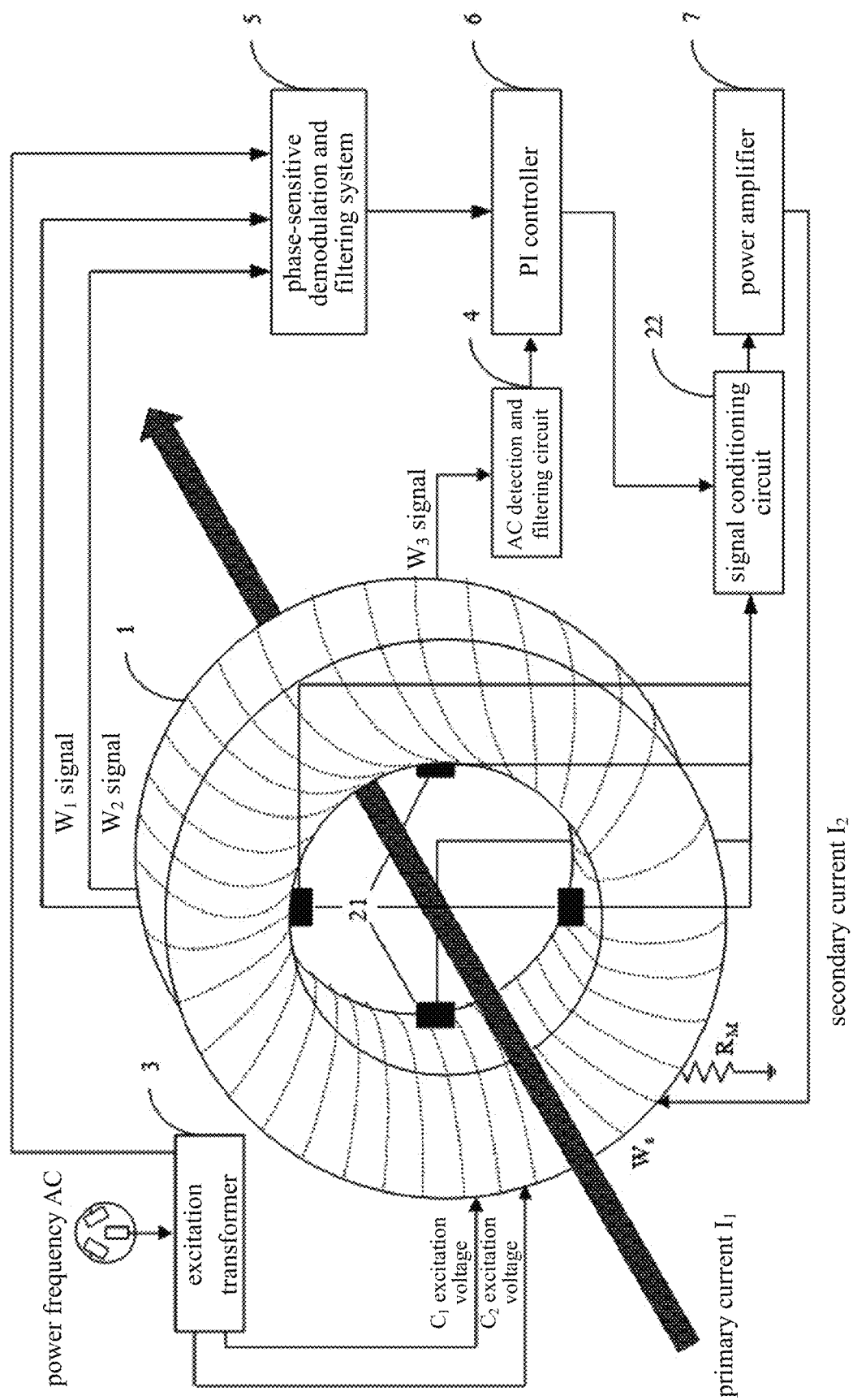
FIG. 1 is a structure diagram of a fast-response direct-current current transformer (DCCT) based on multi-sensor fusion provided by an embodiment of the disclosure.

In the drawings, 1 is a magnetic modulator, 21 is a Hall current sensor array, 22 is a signal conditioning circuit, 3 is an excitation transformer, 4 is an AC detection and filtering circuit, 5 is a phase-sensitive demodulation and filtering system, 6 is a PI controller, and 7 is a power amplifier.

DESCRIPTION OF THE EMBODIMENTS

To better illustrate the goal, technical solutions, and advantages of the disclosure, the following embodiments accompanied with drawings are provided so that the disclosure are further described in detail. It should be understood that the specific embodiments described herein serve to explain the disclosure merely and are not used to limit the disclosure.

The disclosure provides a fast-response direct-current current transformer (DCCT) based on multi-sensor fusion capable of improving dynamic response of a DCCT without affecting steady-state performance such as measurement accuracy, stability, time drifting, and temperature drifting of the DCCT. In this way, a false balance state is prevented from occurring in a dynamic process of the DCCT, automatic recovery of the false balance state caused by live closing, overloading, etc. is achieved, and precise measurement of a dynamic DC heavy current is accomplished.

FIG. 1 illustrates a structure of a fast-response DCCT based on multi-sensor fusion provided by an embodiment of the disclosure, and for ease of description, only parts related to the embodiments of the disclosure are shown and are described in detail as follows.

A fast-response DCCT based on multi-sensor fusion includes: a magnetic modulator 1, a current correction module, an excitation transformer 3, an alternating current (AC) detection and filtering circuit 4, a phase-sensitive demodulation and filtering system 5, a PI controller 6, and a power amplifier 7. Herein, an excitation voltage input terminal of the magnetic modulator 1 is connected to an output terminal of the excitation transformer 3, and a feedback input terminal is connected to an output terminal of the power amplifier 7 and is configured to excite a magnetic core of the magnetic modulator 1 through an excitation voltage. A balance determination signal is outputted by a first signal output terminal to the phase-sensitive demodulation and filtering system (5), and an AC induced voltage signal is outputted by a second signal output terminal to the AC detection and filtering circuit 4. The current correction module is configured to measure a primary current and obtain a feed-forward signal, output a false balance state configured to control a magnetic core to quickly exit or avoid entering magnetic saturation after amplifying the feed-forward signal and a PI control signal, and keep output of the magnetic modulator stable. An input terminal of the excitation transformer 3 is configured to be connected to a power frequency AC. A first output terminal is connected to the excitation voltage input terminal of the magnetic modulator 1, and a second output terminal is connected to a second input terminal of the phase-sensitive demodulation and filtering system 5 and is configured to provide a periodic excitation voltage for the magnetic modulator 1 and provide the phase-sensitive demodulation and filtering system 5 with a required square wave signal. An input terminal of the AC detection and filtering circuit 4 is connected to the second signal output terminal of the magnetic modulator 1 and is configured to perform detecting and filtering on the AC induced voltage signal outputted by the magnetic modulator 1. A first input terminal of the phase-sensitive demodulation and filtering system 5 is connected to a first output terminal of the magnetic modulator 1, and the second input terminal is connected to a third output terminal of the excitation transformer 3 and is configured to perform phase-sensitive demodulation processing on the balance determination signal and output a balance adjustment signal. A first input terminal of the PI controller 6 is connected to an output terminal of the AC detection and filtering circuit 4, and a second input terminal is connected to an output terminal of the phase-sensitive demodulation and filtering system 5 and is configured to perform proportional integral control on the filtered AC induced voltage signal and the balance adjustment signal and output the stable PI control signal. An input terminal of the power amplifier 7 is connected to an output terminal of the current correction module and is configured to output the feed-back signal after performing power amplifying and filtering processing on the feed-forward signal and the PI control signal.

In the disclosure, Hall current sensors and the magnetic modulator are fused. The Hall sensor gives a magnetic core a reverse magnetic flux in real time according to magnitude of the primary current, and in this way, the magnetic core may be prevented from being saturated, or the magnetic core may be "dragged" out of a saturated state when the magnetic core is already saturated. In this way, a current change range that a piece of instrument can measure and withstand is considerably larger than that of an original magnetic modulator alone, that is, "improved dynamic response performance" is achieved. Because the "response time" of the DCCT is the time for a magnetic potential in the magnetic core to reach a balance, output of the Hall sensor is not like that of the magnetic modulator with a considerably complicated closed loop. Instead, as soon as a primary current is available, a reverse magnetic potential is immediately provided to the magnetic core. It thus can be seen that a balance is quickly achieved, that is, "fast response". Because there is no need to perform restarting or scanning, the overall working performance is greatly improved.

In the embodiments of the disclosure, the current correction module is configured to measure the primary current through a current sensor. Obtained sensor output is proportional to the feed-forward signal of the primary current, and the PI control signal outputted by the PI controller 6 is connected to an input terminal of a signal conditioning circuit. After filtering and amplitude modulation processing, the feed-forward signal and the PI control signal are outputted to the input terminal of the power amplifier 6. The feed-forward signal and the PI control signal provide feed-forward input and closed-loop feed-back input to the magnetic modulator 1 after being amplified and control the magnetic core to quickly exit or avoid entering the false balance state of magnetic saturation. As such, output of the magnetic modulator is kept stable.

Figure 2:
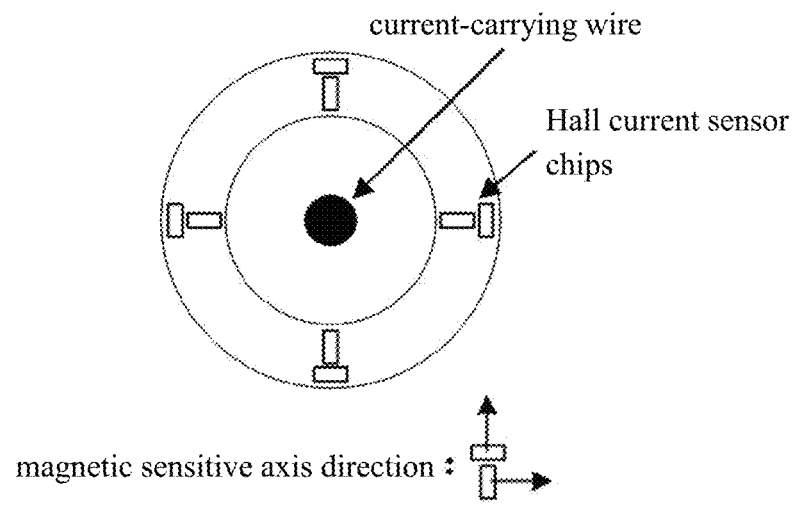
FIG. 2 is a schematic diagram of a position relationship of Hall current sensors in a current correction module in the fast-response DCCT provided by an embodiment of the disclosure.

As shown in FIG. 2, in an embodiment of the disclosure, the current correction module may use a sensor to perform feed-forward correction on the magnetic modulator. To be specific, the current correction module includes: Hall current sensor chips 21 and a signal conditioning circuit 22. The Hall current sensor chips 21 is configured to detect a current to be measured and control the magnetic core to quickly exit or avoid entering the false balance state of the magnetic saturation according to the current to be measured and the feed-forward signal provided by the power amplifier to the magnetic modulator, such that the output of the magnetic modulator is kept stable. The signal conditioning circuit 22 is configured to filter and adjust an output signal of the Hall current sensor chips.

Herein, a number of the Hall current sensor chips 21 may be eight, and the eight Hall current sensor chips 21 are divided into four groups that are perpendicular to each other and symmetrically arranged on an inner side of the ring-shaped magnetic modulator.

In the embodiments of the disclosure, the Hall current sensor chips 21 may also be disposed on an outer side of the magnetic modulator.

In the embodiments of the disclosure, the excitation transformer and the magnetic core and windings thereof act as DC feed-back paths of the DCCT to detect DC and low-frequency magnetic field components. The magnetic modulator adopts a differential structure. A first winding and a second winding are wound in reverse series on two magnetic cores and are configured to detect and output magnitude of magnetic fluxes in the magnetic cores. A secondary side of the excitation transformer is connected to the first winding and the second winding. Alternating magnetic fluxes caused by excitation currents in the two magnetic cores are always equal in magnitude and opposite in direction due to the first and second windings being wound in reverse series. A combined magnetic flux presented is zero, so the excitation current may not cause output in the excitation transformer.

The secondary side of the excitation transformer 3 is connected to a first winding $W_1$ and a second winding $W_2$ of the magnetic modulation sensor 1. Output terminals of the first winding $W_1$ and the second winding $W_2$ are connected to the phase-sensitive demodulation and filtering system. An output terminal of an induction winding $W_3$ of the magnetic modulation sensor is connected to the AC detection and filtering circuit. The phase-sensitive demodulation and filtering system and the output terminal of the AC detection and filtering circuit are connected to the PI controller. An output terminal of the PI controller is connected to the input terminal of the signal conditioning circuit in the current correction module, and the output terminal thereof is connected to the power amplifier. The output terminal of the power amplifier is connected to a secondary winding $W_S$ of the magnetic modulation sensor.

Materials of the modulation magnetic cores generally are ferromagnetic materials with a high rectangular coefficient and a small coercive force such as a cold-rolled silicon steel sheet with crystal grain orientation, permalloy, or amorphous alloy. The modulation magnetic cores are ring-shaped most of the time, a diameter of each of the modulation magnetic cores is determined by factors such as a measured busbar and a number of turns of the secondary winding, and the busbar is required to be ensured to pass through an inside of a modulation iron core ring when a DC heavy current is measured. Selection of a cross-sectional area of a modulation iron core should ensure a slenderness ratio of the iron core. For instance, a ratio of an average circumference of the ring to the cross-sectional area may be selected to be greater than 50, and an optimal effect is determined by experiment. In this embodiment, the modulation magnetic core is made by winding of high permeability amorphous alloy, and an average diameter of the sensor may be 1,124 mm.

Figure 3:
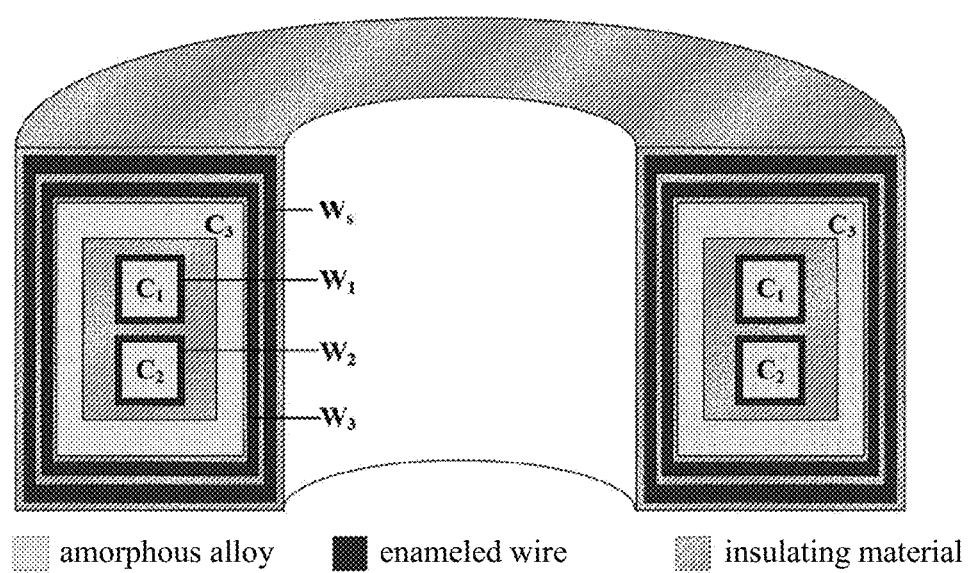
FIG. 3 is a structure diagram of a magnetic modulator coil in the fast-response DCCT provided by an embodiment of the disclosure.

FIG. 3 illustrates a geometrical structure diagram of a magnetic modulator coil provided by an embodiment of the disclosure. The first winding $W_1$ and the second winding $W_2$ are wound in reverse series on a first magnetic core $C_1$ and a second magnetic core $C_2$ and are configured to detect and output magnitude of magnetic fluxes in the magnetic cores. the induction winding $W_3$ is wound on an AC feed-back magnetic core $C_3$ and is configured to detect magnitude of a magnetic flux in the AC feed-back magnetic core.

In an embodiment of the disclosure, structural parameters of the first winding $W_1$ and the second winding $W_2$ are kept the same, and the first winding $W_1$ and the second winding $W_2$ are wound in reverse series. Alternating magnetic fluxes caused by excitation currents in the first magnetic core $C_1$ and the second magnetic core $C_2$ keep equal in magnitude and opposite in direction at all times. A combined magnetic flux presented is zero, so the excitation current may not cause output in the excitation transformer.

Magnetic properties of the modulation magnetic cores are determined by materials, and the number of turns of each of the first winding $W_1$ and the second winding $W_2$ may generally be 1,000 turns. A wire diameter is determined according to magnitude of the excitation current, current density of a closely-wound coil is not greater than 2.5

A/mm² according to s national standard, and an output resistance value and an excitation voltage value are determined according to magnitude of an output signal. In this embodiment, cross-sectional dimensions of the first magnetic core $C_1$ and the second magnetic core $C_2$ are both 10 mm×8 mm, the corresponding excitation first winding $W_1$ and second winding $W_2$ are wound with 0.2 mm enameled wires, and the number of turns is 1,000 turns. No special requirement is needed regarding the number of turns of the excitation windings, as long as the windings can carry current ampere-turns required at a peak magnetic potential.

A thickness of an iron core shielding layer is usually 5 mm, and the iron core shielding layer is wound with a high-permeability material strip such as a cold-rolled silicon steel sheet with crystal grain orientation, permalloy, or amorphous alloy. A gap between the iron core shielding layer and the modulation iron core is filled with electrical potting of smidahk or other insulating fillers.

The secondary winding $W_S$ is wound on the first magnetic core $C_1$, the second magnetic core $C_2$, and the AC feed-back magnetic core $C_3$. The secondary winding is configured to ensure a balance kept between a DC magnetic potential generated through a secondary current $I_2$ and a magnetic potential of a primary current $I_1$ and calculate a primary current value through magnitude of the secondary current. The number of turns of the secondary winding depends on the magnitude of the primary current and a rated value of the secondary current.

According to the principle of zero magnetic flux, when the magnetic potential is balanced, $N_1I_1=N_2I_2$, and the busbar of the primary current passes through the magnetic core during current measurement, so $N_1=1$, that is $I_2=(N_1I_1)N_2$. The wire diameter is selected according to the national standard that the current density of the closely-wound coil is not greater than 2.5 A/mm² and $I_2$. A measured maximum current is 30 kA, the number of winding turns is 10,000, and the enameled wire with a wire diameter of 1.2 mm is used for winding in this embodiment.

The AC feed-back magnetic core $C_3$ and its induction winding act as AC feed-back paths of the DCCT to detect an intermediate frequency AC magnetic field component and suppress a system induced ripple. The induction winding is wound on an AC feed-back magnetic core and is configured to detect magnitude of a magnetic flux in the AC feed-back magnetic core. An output voltage of the induction winding after passing through the AC detection and filtering circuit, an output voltage of the magnetic modulator, and a control amount acting as the PI controller, through the power amplifier, drive the secondary winding to form a zero-flux closed-loop feed-back control.

The AC feed-back magnetic core $C_3$ acts as a magnetic shield of each of an AC detection magnetic core, a transformer magnetic core, and a magnetic core at the same time, and a cross-sectional wall thickness thereof is 10 mm, a cross-sectional height is 45 mm, and a cross-sectional width is 28 mm. An upper left corner of the magnetic core is filled with a 1 mm insulating filler to prevent formation of a loop in a winding direction from generating a vortex flow path. The AC detection induction winding $W_3$ is in an open state and no current flows through it, so there is no requirement for the wire diameter. 0.2 mm enameled wire is used for winding in this embodiment, and the number of winding turns is related to sensitivity of an AC detection branch. Nevertheless, the output signal is also required to go through the signal conditioning circuit, so selection of the number of turns is not strict, and 1,000 turns are selected in this embodiment. The design of the feed-back winding needs to comprehensively consider a range and measurement of the secondary current to determine the number of winding turns, that is, a transformation ratio of a primary current to the secondary current. A large number of turns means that the secondary current is small, which is conducive to the measurement of the secondary current, and it also means that winding resistance and inductance are large, which may increase design difficulty of the power amplifier. Further, the large number of turns may increase a distribution parameter of the winding.

An excitation amplifier of the fast-response DCCT based on multi-sensor fusion in the disclosure selects power frequency of 50 Hz as the excitation frequency of magnetic modulation. An excitation source is directly obtained from a power frequency transformer with a center tap run through by mains electricity.

Figure 4:
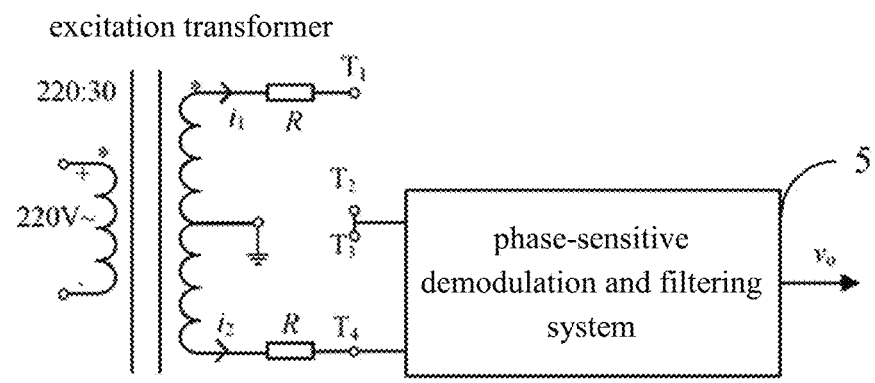
FIG. 4 is a schematic diagram of a connection relationship between a phase-sensitive demodulation and filtering system and an excitation transformer 3 in the fast-response DCCT provided by an embodiment of the disclosure.

FIG. 4 illustrates a connection relationship between the phase-sensitive demodulation and filtering system 5 and the excitation transformer 3 in the fast-response DCCT provided by an embodiment of the disclosure. $T_1$, $T_2$, $T_3$, and $T_4$ respectively are input terminals of excitation the first winding $W_1$ and the second winding $W_2$. A differential voltage of the two windings passes through a dual T-type frequency selecting network and a second-order band-pass filter to output a second harmonic voltage v(2f), where a center frequency f1=100 Hz, and a quality factor $Q_1$=5. A square wave required for phase-sensitive demodulation is generated by the comparator after the excitation voltage is rectified. A phase error generated by a phase adjustment and compensation filter is then used to ensure phase synchronization of the second harmonic voltage v (2f) and the square wave voltage v (s). v (2f) and v (s) undergo phase-sensitive demodulation through an analog multiplier AD633 and then are outputted through the second-order low-pass filter, where a low pass filter cut-off frequency is 20 Hz, and the quality factor $Q_2$=0.5.

Figure 5:
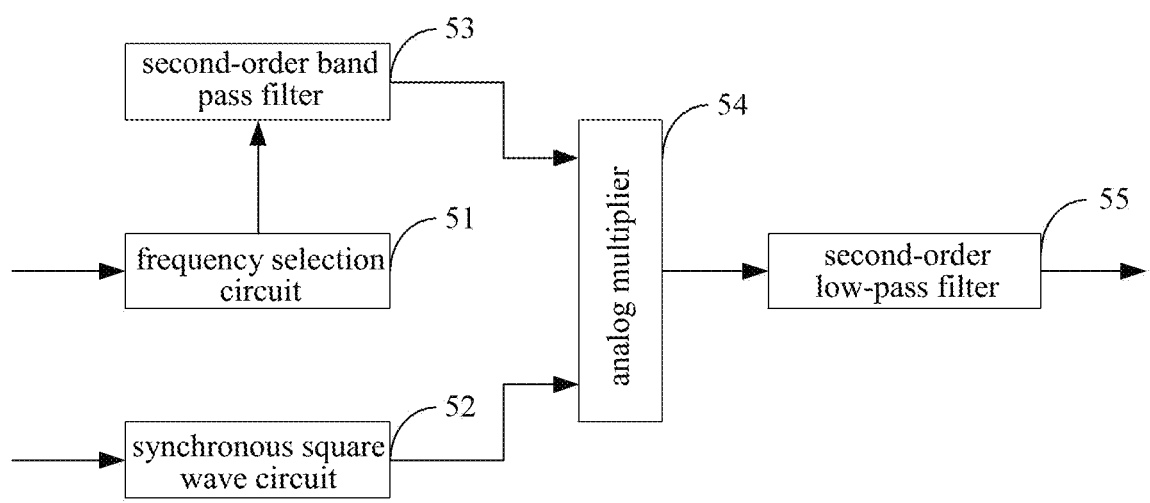
FIG. 5 is a schematic diagram of a module structure of the phase-sensitive demodulation and filtering system provided by an embodiment of the disclosure.

FIG. 5 illustrates a module structure of the phase-sensitive demodulation and filtering system provided by an embodiment of the disclosure. The phase-sensitive demodulation and filtering system 5 includes: a frequency selection circuit 51, a synchronous square wave circuit 52, a second-order band pass filter 53, an analog multiplier 54, and a second-order low-pass filter 55. An input terminal of the frequency selection circuit 51 acts as the first input terminal of the phase-sensitive demodulation and filtering system 5 and is configured to extract a second harmonic signal in a winding input signal. An input terminal of the synchronous square wave circuit 52 acts as the second input terminal of the phase-sensitive demodulation and filtering system 5 and is configured to process the excitation voltage and ensure phase synchronization of an outputted phase reference square wave signal and the second harmonic signal outputted by the frequency selection circuit. An input terminal of the second-order band pass filter 53 is connected to an output terminal of the frequency selection circuit 51 and is configured to filter the second harmonic signal. A first input terminal of the analog multiplier 54 is connected to an output terminal of the second-order band pass filter 53, and a second input terminal is connected to an output terminal of the synchronous square wave circuit 52 and is configured to output the balance adjustment signal after performing phase-sensitive demodulation on the filtered second harmonic signal and the phase reference square wave signal. An input terminal of the second-order low-pass filter 55 is connected to an output terminal of the analog multiplier and is configured to output a balance adjustment signal without high frequency noise after filtering the balance adjustment signal.

Functions of the PI controller 6 and the power amplifier 7 are explained in detail as follows. An output signal $v_{ac}$ of an AC detection winding passes through a 20 kHz second-order low-pass filter to eliminate noise interference. Both $v_{ac}$ and $v_o$ are used as PI controller inputs, a PI controller parameter is $K_p=0.6$, and $\tau=0.22$ s. The PI controller and the Hall current sensor perform outputting to the power amplifier together.

The power amplifier 7 may adopt a class AB linear amplifier, which is formed by 8 parallel MJL4302 and MJL4281 complementary pairs of tubes, and a power supply voltage is ±140V. In order to improve stability of the system, an RC partial negative feed-back network is introduced, and a power amplifier gain KPA=14 after the design is completed. The voltage signal adjusted by the power amplifier is outputted to the secondary winding $W_S$ of the magnetic modulator.

In order to further illustrate the fast-response DCCT based on multi-sensor fusion provided by the embodiments of the disclosure, the working process is described in detail with reference to the accompanying drawings as follows.

For ease of description, the coupling effect of each branch in a transition phase of a frequency band is not considered for the time being. A normal working state is introduced first, that is, when a measured primary current value is unchanged or changes within a small range, a magnetic core does not become saturated during the dynamic process, the mutual inductance is not affected by the saturation of the magnetic core. The normal working state is the working process of the DCCT when the entire measurement system may be treated as a linear system.

When a primary current $I_1$ is in a lower frequency band (including DC), it is generally below $f_{ex}/2$. At this time, the output voltage of the AC detection induction winding $W_3$ is zero, and mutual inductance between a primary current loop and the secondary winding is not provided. Herein, $f_{ex}$ is an excitation voltage frequency of the excitation transformer, generally 50 Hz. At this time, a Hall current sensor array detects the primary current and outputs a constant voltage, which enters the power amplifier after passing through the signal conditioning circuit. Output of a magnetic modulation amplifier is inputted to the power amplifier after passing through the PI controller and the signal conditioning circuit. After total output of fusion of the two sensors passes through the power amplifier, a closed loop is formed through the secondary winding $W_S$ and a sampling resistor $R_M$. When the measurement system is in a stable state, that is, $N_1I_1=N_2I_2$, and the measured magnetic potential in the magnetic core is zero, the output signal of the magnetic modulation amplifier is zero at this time, and an integral action of the PI controller keeps the output stable. The output of the Hall current sensor is only related to the measured current, so the stable output remains unchanged. At this time, the measured primary current $I_1=(N_2I_2)/N_1$.

When the primary current $I_1$ is in a middle and high frequency range, the Hall current sensor array detects an AC current and outputs a constant voltage, which enters the power amplifier after passing through the signal conditioning circuit. An output voltage of a magnetic modulation amplifier branch is zero. Regardless of the mutual inductance between the primary current loop and the secondary winding, the primary current generates an induced voltage in the AC detection induction winding $W_3$, which is inputted to the power amplifier after passing through the PI controller and the signal conditioning circuit. At this time, the magnetic modulator acts as an AC current comparator to maintain a zero magnetic flux state. The adjustment process is similar to the low frequency, except that a magnetic flux error control signal comes from an electromagnetic induction voltage of the AC detection induction winding $W_3$ and the output voltage of the Hall current sensor array.

When working is normally performed actually, the above three working states are coupled with each other. When the measured signal changes, the mutual inductance between the output of the Hall current sensor and the magnetic modulator takes effect first. When a mutual inductance magnetic core is not saturated, the zero magnetic flux state may be maintained in the secondary winding under the action of the Hall sensor and the mutual inductance. As a current-time product (ampere-second product) increases, the mutual inductance magnetic core gradually saturates. The Hall sensor, the magnetic modulator, and an AC detection iron core work together to control the output of the power amplifier, drive the secondary winding, and maintain the zero magnetic field state.

In an abnormal working state, that is, the primary current has a large variation range, the saturation of the mutual inductance magnetic core during the dynamic process causes the mutual inductance to drop rapidly. If the power amplifier cannot produce output in time to maintain the secondary current, the secondary current may drop rapidly, causing an unbalanced current to exceed a linear range of the magnetic modulation amplifier. The closed-loop system of the DCCT loses stability and enters the false balance state.

When the measured primary current changes in a large range and the false balance has occurred, the magnetic modulation amplifier in the multi-sensor fusion system cannot work due to the saturation of the magnetic core. The Hall current sensor array outputs a voltage that changes in the same proportion according to the measured primary current and directly controls the power amplifier to drive the secondary winding, so that the magnetic core of the magnetic modulation amplifier is discharged from magnetic saturation and returns to the normal working state.

When the measured primary current changes in a large range and the false balance has not yet occurred, the Hall current sensor branch plays a feed-forward role. When the measured primary current changes, the Hall current sensor array and the magnetic modulation amplifier produce mutual inductance and work together. The instant output of the power amplifier avoids saturation of the mutual inductance magnetic core and strengthens the mutual inductance capability of the magnetic modulation amplifier. Mutual inductance may make the system enter the zero magnetic flux state faster, so that the DCCT has a stronger dynamic response capability and may respond quickly when faced with a wide range of current amplitude changes. After the primary current enters the steady state, the output of the Hall sensor gives the power amplifier a static operating point, and the feed-back loop of the magnetic modulator only needs to provide a small voltage to ensure zero magnetic flux.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A fast-response direct-current transformer (DCCT) based on multi-sensor fusion, comprising: a magnetic modulator (1), a current correction module, an excitation transformer (3), an alternating current detection and filtering circuit (4), a phase-sensitive demodulation and filtering system (5), a PI controller (6), and a power amplifier (7),
- wherein an excitation voltage input terminal of the magnetic modulator (1) is connected to an output terminal of the excitation transformer (3), a feed-back input terminal is connected to an output terminal of the power amplifier (7) and is configured to excite a magnetic core of the magnetic modulator (1) through an excitation voltage, a balance determination signal is outputted by a first signal output terminal to the phase-sensitive demodulation and filtering system (5), and an alternating current induced voltage signal is outputted by a second signal output terminal to the alternating current detection and filtering circuit (4),
- wherein the current correction module is configured to measure a primary current and obtain a feed-forward signal, output a false balance state configured to control a magnetic core to quickly exit or avoid entering magnetic saturation after amplifying the feed-forward signal and a PI control signal, and keep output of the magnetic modulator stable,
- wherein an input terminal of the excitation transformer (3) is configured to be connected to a power frequency alternating current, a first output terminal is connected to the excitation voltage input terminal of the magnetic modulator (1), and a second output terminal is connected to a second input terminal of the phase-sensitive demodulation and filtering system (5) and is configured to provide a periodic excitation voltage for the magnetic modulator (1) and provide the phase-sensitive demodulation and filtering system (5) with a required square wave signal,
- wherein an input terminal of the alternating current detection and filtering circuit (4) is connected to the second signal output terminal of the magnetic modulator (1) and is configured to perform detecting and filtering on the alternating current induced voltage signal outputted by the magnetic modulator (1),
- wherein a first input terminal of the phase-sensitive demodulation and filtering system (5) is connected to a first output terminal of the magnetic modulator (1), and the second input terminal is connected to a third output terminal of the excitation transformer (3) and is configured to perform phase-sensitive demodulation processing on the balance determination signal and output a balance adjustment signal,
- wherein a first input terminal of the PI controller (6) is connected to an output terminal of the alternating current detection and filtering circuit (4), and a second input terminal is connected to an output terminal of the phase-sensitive demodulation and filtering system (5) and is configured to perform proportional integral control on the filtered alternating current induced voltage signal and the balance adjustment signal and output the stable PI control signal,
- wherein an input terminal of the power amplifier (7) is connected to an output terminal of the current correction module and is configured to output the feed-back signal after performing power amplifying and filtering processing on the feed-forward signal and the PI control signal.

2. The fast-response DCCT according to claim 1, wherein the magnetic modulator (1) comprises: a first magnetic core $C_1$, a second magnetic core $C_2$, an alternating current feed-back magnetic core $C_3$, a first winding $W_1$, a second winding $W_2$, an alternating current induction winding $W_3$, and a secondary winding $W_s$,
- wherein the first magnetic core $C_1$ and the second magnetic core $C_2$ are disposed parallel to each other, and the first magnetic core $C_1$ and the second magnetic core $C_2$ are disposed in the alternating current feed-back magnetic core $C_3$ after being wrapped by an insulating material,
- wherein the first winding $W_1$ is wound on the first magnetic core $C_1$, the second winding $W_2$ is wound on the second magnetic core $C_2$, and the first winding $W_1$ and the second winding $W_2$ are connected in series, configured to detect magnitude of a magnetic flux in the first magnetic core $C_1$ and the second magnetic core $C_2$, and output the balance determination signal,
- wherein the induction winding $W_3$ is wound on the alternating current feed-back magnetic core $C_3$, and the alternating current induction winding $W_3$ is configured to detect magnitude of a magnetic flux in the alternating current feed-back magnetic core and output the alternating current induced voltage signal,
- wherein the secondary winding $W_s$ is wound on the insulating material that wraps the alternating current feed-back magnetic core $C_3$, configured to ensure a balance kept between a direct current magnetic potential generated by a secondary current $I_2$ and a magnetic potential of a primary current $I_1$, and calculate a current value to be measured according to magnitude of the secondary current.

3. The fast-response DCCT according to claim 2, wherein the first winding $W_1$ and the second winding $W_2$ are connected in reverse series, and alternating magnetic fluxes caused by excitation currents in the first magnetic core $C_1$ and the second magnetic core $C_2$ keep equal in magnitude and opposite in direction at all times.

4. The fast-response DCCT according to claim 3, wherein materials of the first magnetic core $C_1$ and the second magnetic core $C_2$ are both ferromagnetic materials with a high rectangular coefficient and a small coercive force.

5. The fast-response DCCT according to claim 4, wherein the materials of the first magnetic core $C_1$ and the second magnetic core $C_2$ are both cold-rolled silicon steel sheets with crystal grain orientation, permalloy, or amorphous alloy.

6. The fast-response DCCT according to claim 3, wherein the phase-sensitive demodulation and filtering system (5) comprises: a frequency selection circuit (51), a synchronous square wave circuit (52), a second-order band pass filter (53), an analog multiplier (54), and a second-order low-pass filter (55),
- wherein an input terminal of the frequency selection circuit (51) acts as the first input terminal of the phase-sensitive demodulation and filtering system (5) and is configured to extract a second harmonic signal in a winding input signal,
- wherein an input terminal of the synchronous square wave circuit (52) acts as the second input terminal of the phase-sensitive demodulation and filtering system (5) and is configured to process an excitation voltage and ensure phase synchronization of an outputted phase reference square wave signal and the second harmonic signal outputted by the frequency selection circuit,
- wherein an input terminal of the second-order band pass filter (53) is connected to an output terminal of the frequency selection circuit (51) and is configured to filter the second harmonic signal,
- wherein a first input terminal of the analog multiplier (54) is connected to an output terminal of the second-order band pass filter (53), and a second input terminal is connected to an output terminal of the synchronous square wave circuit (52) and is configured to output the balance adjustment signal after performing phase-sensitive demodulation on the filtered second harmonic signal and the phase reference square wave signal, wherein an input terminal of the second-order low-pass filter (55) is connected to an output terminal of the analog multiplier and is configured to output a balance adjustment signal without high frequency noise after filtering the balance adjustment signal.

7. The fast-response DCCT according to claim 2, wherein materials of the first magnetic core $C_1$ and the second magnetic core $C_2$ are both ferromagnetic materials with a high rectangular coefficient and a small coercive force.

8. The fast-response DCCT according to claim 7, wherein the materials of the first magnetic core $C_1$ and the second magnetic core $C_2$ are both cold-rolled silicon steel sheets with crystal grain orientation, permalloy, or amorphous alloy.

9. The fast-response DCCT according to claim 8, wherein the phase-sensitive demodulation and filtering system (5) comprises: a frequency selection circuit (51), a synchronous square wave circuit (52), a second-order band pass filter (53), an analog multiplier (54), and a second-order low-pass filter (55), wherein an input terminal of the frequency selection circuit (51) acts as the first input terminal of the phase-sensitive demodulation and filtering system (5) and is configured to extract a second harmonic signal in a winding input signal, wherein an input terminal of the synchronous square wave circuit (52) acts as the second input terminal of the phase-sensitive demodulation and filtering system (5) and is configured to process an excitation voltage and ensure phase synchronization of an outputted phase reference square wave signal and the second harmonic signal outputted by the frequency selection circuit, wherein an input terminal of the second-order band pass filter (53) is connected to an output terminal of the frequency selection circuit (51) and is configured to filter the second harmonic signal, wherein a first input terminal of the analog multiplier (54) is connected to an output terminal of the second-order band pass filter (53), and a second input terminal is connected to an output terminal of the synchronous square wave circuit (52) and is configured to output the balance adjustment signal after performing phase-sensitive demodulation on the filtered second harmonic signal and the phase reference square wave signal, wherein an input terminal of the second-order low-pass filter (55) is connected to an output terminal of the analog multiplier and is configured to output a balance adjustment signal without high frequency noise after filtering the balance adjustment signal.

10. The fast-response DCCT according to claim 7, wherein the phase-sensitive demodulation and filtering system (5) comprises: a frequency selection circuit (51), a synchronous square wave circuit (52), a second-order band pass filter (53), an analog multiplier (54), and a second-order low-pass filter (55), wherein an input terminal of the frequency selection circuit (51) acts as the first input terminal of the phase-sensitive demodulation and filtering system (5) and is configured to extract a second harmonic signal in a winding input signal, wherein an input terminal of the synchronous square wave circuit (52) acts as the second input terminal of the phase-sensitive demodulation and filtering system (5) and is configured to process an excitation voltage and ensure phase synchronization of an outputted phase reference square wave signal and the second harmonic signal outputted by the frequency selection circuit, wherein an input terminal of the second-order band pass filter (53) is connected to an output terminal of the frequency selection circuit (51) and is configured to filter the second harmonic signal, wherein a first input terminal of the analog multiplier (54) is connected to an output terminal of the second-order band pass filter (53), and a second input terminal is connected to an output terminal of the synchronous square wave circuit (52) and is configured to output the balance adjustment signal after performing phase-sensitive demodulation on the filtered second harmonic signal and the phase reference square wave signal, wherein an input terminal of the second-order low-pass filter (55) is connected to an output terminal of the analog multiplier and is configured to output a balance adjustment signal without high frequency noise after filtering the balance adjustment signal.

11. The fast-response DCCT according to claim 2, wherein the current correction module comprises: Hall current sensor chips (21) and a signal conditioning circuit (22), wherein the Hall current sensor chips (21) is configured to detect a current to be measured and control the magnetic core to quickly exit or avoid entering the false balance state of the magnetic saturation according to the current to be measured and the feed-forward signal provided by the power amplifier (7) to the magnetic modulator (1), such that the output of the magnetic modulator is kept stable, wherein the signal conditioning circuit (22) is configured to filter and adjust output signals of the Hall current sensor chips (21) and the PI controller (6).

12. The fast-response DCCT according to claim 11, wherein a number of the Hall current sensor chips (21) is eight, and the eight Hall current sensor chips (21) are divided into four groups that are perpendicular to each other and symmetrically arranged on an inner side of the ring-shaped magnetic modulator.

13. The fast-response DCCT according to claim 2, wherein the phase-sensitive demodulation and filtering system (5) comprises: a frequency selection circuit (51), a synchronous square wave circuit (52), a second-order band pass filter (53), an analog multiplier (54), and a second-order low-pass filter (55), wherein an input terminal of the frequency selection circuit (51) acts as the first input terminal of the phase-sensitive demodulation and filtering system (5) and is configured to extract a second harmonic signal in a winding input signal, wherein an input terminal of the synchronous square wave circuit (52) acts as the second input terminal of the phase-sensitive demodulation and filtering system (5) and is configured to process an excitation voltage and ensure phase synchronization of an outputted phase reference square wave signal and the second harmonic signal outputted by the frequency selection circuit, wherein an input terminal of the second-order band pass filter (53) is connected to an output terminal of the frequency selection circuit (51) and is configured to filter the second harmonic signal, wherein a first input terminal of the analog multiplier (54) is connected to an output terminal of the second-order band pass filter (53), and a second input terminal is connected to an output terminal of the synchronous square wave circuit (52) and is configured to output the balance adjustment signal after performing phase-sensitive demodulation on the filtered second harmonic signal and the phase reference square wave signal, wherein an input terminal of the second-order low-pass filter (55) is connected to an output terminal of the analog multiplier and is configured to output a balance adjustment signal without high frequency noise after filtering the balance adjustment signal.

14. The fast-response DCCT according to claim 1, wherein the current correction module comprises: Hall current sensor chips (21) and a signal conditioning circuit (22), wherein the Hall current sensor chips (21) is configured to detect a current to be measured and control the magnetic core to quickly exit or avoid entering the false balance state of the magnetic saturation according to the current to be measured and the feed-forward signal provided by the power amplifier (7) to the magnetic modulator (1), such that the output of the magnetic modulator is kept stable, wherein the signal conditioning circuit (22) is configured to filter and adjust output signals of the Hall current sensor chips (21) and the PI controller (6).

15. The fast-response DCCT according to claim 14, wherein a number of the Hall current sensor chips (21) is eight, and the eight Hall current sensor chips (21) are divided into four groups that are perpendicular to each other and symmetrically arranged on an inner side of the ring-shaped magnetic modulator.

16. The fast-response DCCT according to claim 1, wherein the phase-sensitive demodulation and filtering system (5) comprises: a frequency selection circuit (51), a synchronous square wave circuit (52), a second-order band pass filter (53), an analog multiplier (54), and a second-order low-pass filter (55), wherein an input terminal of the frequency selection circuit (51) acts as the first input terminal of the phase-sensitive demodulation and filtering system (5) and is configured to extract a second harmonic signal in a winding input signal, wherein an input terminal of the synchronous square wave circuit (52) acts as the second input terminal of the phase-sensitive demodulation and filtering system (5) and is configured to process an excitation voltage and ensure phase synchronization of an outputted phase reference square wave signal and the second harmonic signal outputted by the frequency selection circuit, wherein an input terminal of the second-order band pass filter (53) is connected to an output terminal of the frequency selection circuit (51) and is configured to filter the second harmonic signal, wherein a first input terminal of the analog multiplier (54) is connected to an output terminal of the second-order band pass filter (53), and a second input terminal is connected to an output terminal of the synchronous square wave circuit (52) and is configured to output the balance adjustment signal after performing phase-sensitive demodulation on the filtered second harmonic signal and the phase reference square wave signal, wherein an input terminal of the second-order low-pass filter (55) is connected to an output terminal of the analog multiplier and is configured to output a balance adjustment signal without high frequency noise after filtering the balance adjustment signal.

\* \* \* \* \*